(12) United States Patent
Moto

(10) Patent No.: US 7,782,915 B2
(45) Date of Patent: Aug. 24, 2010

(54) OPTICAL TRANSMITTING MODULE INCLUDING LASER DIODE MOUNTED ON DRIVER CIRCUIT

(75) Inventor: Akihiro Moto, Kanagawa (JP)

(73) Assignee: Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 11/507,666

(22) Filed: Aug. 22, 2006

(65) Prior Publication Data
US 2007/0053392 A1   Mar. 8, 2007

(30) Foreign Application Priority Data
Aug. 25, 2005 (JP) .............................. 2005-244254

(51) Int. Cl.
*H01S 3/00* (2006.01)
(52) U.S. Cl. ................................ 372/38.01; 372/29.011
(58) Field of Classification Search ................ 372/38.1, 372/20, 34, 36, 38.01; 257/184; 362/554
See application file for complete search history.

(56) References Cited

U.S. PATENT DOCUMENTS

| | | | | |
|---|---|---|---|---|
| 6,072,815 | A * | 6/2000 | Peterson | 372/36 |
| 6,321,003 | B1 * | 11/2001 | Kner et al. | 385/24 |
| 6,327,287 | B1 * | 12/2001 | Kner et al. | 372/43.01 |
| 6,534,794 | B1 * | 3/2003 | Nakanishi et al. | 257/79 |
| 2005/0100064 | A1 * | 5/2005 | Stewart et al. | 372/36 |
| 2005/0105572 | A1 * | 5/2005 | Simoun-Ou et al. | 372/36 |
| 2005/0105573 | A1 * | 5/2005 | Hayashi et al. | 372/38.01 |
| 2005/0111503 | A1 * | 5/2005 | Ishigami et al. | 372/38.1 |

FOREIGN PATENT DOCUMENTS

| | | |
|---|---|---|
| JP | 61-55985 | 3/1986 |
| JP | 8-116136 | 5/1996 |
| JP | 08-116136 | 5/1996 |
| JP | 08-130320 | 5/1996 |
| JP | 11-054839 | 2/1999 |
| JP | 2001-244485 | 9/2001 |
| JP | 2004-247458 | 9/2004 |
| WO | 03/0063309 | 7/2003 |

OTHER PUBLICATIONS

Japanese Office Action issued Nov. 17, 2009 for Japanese Application No. 2005-244254 w/English language translation.

\* cited by examiner

*Primary Examiner*—Minsun Harvey
*Assistant Examiner*—Tuan N. Nguyen
(74) *Attorney, Agent, or Firm*—Smith, Gambrell & Russell, LLP

(57) ABSTRACT

The present invention is to provide alight emitting module that improves the positional precision of a semiconductor laser diode. A light emitting module of the present invention is configured with a semiconductor laser diode having a facet which inputs, or outputs light; an integrated circuit which is electrically connected to the semiconductor laser diode; and a package which mounts the semiconductor laser diode and the integrated circuit therein. The semiconductor laser diode is mounted on the integrated circuit, and the integrated circuit has a marker. The marker is utilized in determining a position of the semiconductor laser diode with respect to the integrated circuit, and further in determining a position of the semiconductor laser diode with respect to the package.

10 Claims, 8 Drawing Sheets

US 7,782,915 B2

OPTICAL TRANSMITTING MODULE INCLUDING LASER DIODE MOUNTED ON DRIVER CIRCUIT

BACKGROUND OF THE INVENTION

1. Field of the Invention

The present invention is related to a light emitting module.

2. Description of the Related Art

Japanese Patent Application Publication No. JP-A-08-130320 discloses a light emitting module comprising a package, a heat sink, a sub-mount, and a semiconductor laser diode (will be referred to as "LD" hereinafter) The package includes a stem and a cap, and the heat sink is mounted on the stem. The heat sink has a mounting surface extending along an optical axis direction, and the LD is mounted on the mounting surface via the sub-mount.

In the light emitting module, the LD is fixed to the sub-mount, and the sub-mount is fixed to the mounting plane with solder. That is, the LD is first mounted on the sub-mount, and, the sub-mount on which the LD has been mounted is thereafter mounted on the heat sink. However, the latter soldering may affect the former solder, which may cause a shift of the optical axis of the LD.

SUMMARY OF THE INVENTION

An aspect of the present invention relates to an light emitting module which receives an electric signal and transmits an optical signal corresponding to the received electric signal. The light emitting module includes a LD for emitting an optical signal, an integrated circuit (will be referred to as "IC" hereinafter) for driving the LD; and a housing for installing the LD and the IC, wherein the LD is mounted on the IC. The IC may be a silicon IC. Since a thermal conductivity of silicon is larger than that of ceramics, the silicon IC may function as a heat sink for the semiconductor laser diode.

The package in the present invention includes, distinctively, a disk-shaped stem and a cylindrical-shaped lens cap. The lens cap is coupled to the stem. This package may be formed as, what is called, a "coaxial package." Both the LD and the IC are installed within a space formed by the stem and the lens cap. A sub-mount with a convex shape is formed on a primary surface of the stem, and the IC may be mounted on a side surface of the sub-mount. Also, the LD may be an edge emitting type semiconductor laser diode, and is mounted on the IC such that the light emitting facet is arranged along one edge of the IC. Since the LD is mounted in the above-explained manner, a driver IC may be arranged with a margin even in the coaxial-shaped package whose mounting space is limited. Further, while a groove for mounting therein the LD is provided on the IC, a marker for the positioning is formed on the IC, so that the LD can be precisely mounted on the groove. In addition, the IC can be securely mounted on a side surface of the sub-mount.

Furthermore, the light emitting module also mounts thereon a photodiode (will be referred to as "PD" hereinafter) that detects a magnitude of light emitted from another facet of the LD. More specifically, this PD may be built within the IC. Alternatively, a groove continuing to the groove for mounting the LD thereon may be formed, and the PD may be mounted in thus formed groove. Also, a monitor circuit for processing a photo-current output from the PD may be built within the IC. Since a distance from the PD to the monitor circuit is considerably shortened, an influence caused by noise may be easily avoidable.

While the IC includes a transistor which is connected in parallel to the LD, this IC may be configured as, what is called, a "shunt type driver circuit" which turns off the LD by shunting a current flowing through the LD. Otherwise, while the IC includes a transistor which is connected in series to the LD, this IC may be configured as, what is called, a "series type driver circuit" that turns on and off a current flowing through the LD by switching the transistor. In particular, the shunt type driver circuit can effectively utilize a merit that a total number of integrated elements is small and the IC may be applicable as a heat sink for the LD.

BRIEF DESCRIPTION OF THE INVENTION

DESCRIPTION OF THE PREFERRED EMBODIMENTS

Referring now to drawings, preferred embodiments of the present invention will be described in detail. The same numerals will be applied as those for denoting the same, or corresponding components in the respective drawings.

First Embodiment

Figure 1:
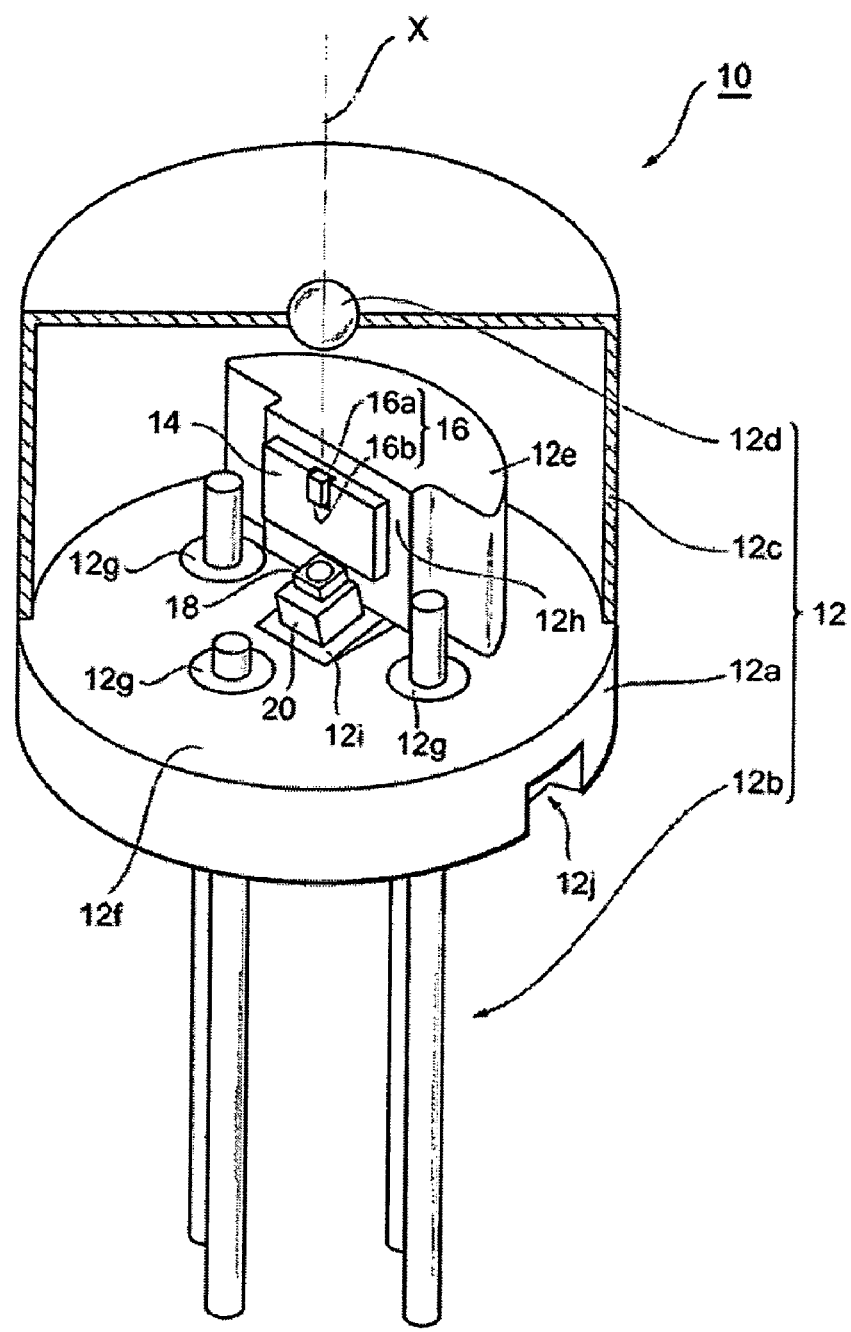
FIG. 1 is a perspective view for illustrating a light emitting module according to an embodiment of the present invention, while the light emitting module is partially cut away.

FIG. 1 is a perspective view illustrating a light emitting module 10 according to an embodiment of the present invention, while the light emitting module 10 is partially cut away. The light emitting module 10 shown in FIG. 1 has, what is called, a "coaxial type shape", and comprises a package 12, an IC 14, an LD 16, and a PD 18. These IC 14, LD 16, and PD 18 are installed within an air-tight space, while the air-tight space is formed by a disk-shaped stem 12a and a cylindrical-shaped lens cap 12c, which constitute the package 12.

The package 12 includes the stem 12a, a plurality of lead terminals 12b, the lens cap 12c, and a lens 12d. The stem 12a has a mounting surface 12f located along a plane which intersects a predetermined axial line "X", and also, a plurality of holes are formed in the stem 12a. The lead terminals 12b pass through these plural holes elongated along the direction of the axial line "X." Gaps of the holes into which the lead terminals 12b are inserted are sealed by sealing members 12g. Generally, glass with a low melting point is used as the sealing members 12g.

One edge of the lens cap 12c is fixed on a peripheral portion of a supporting surface 12f of the stem 12a. This lens cap 12c is a substantially cylindrical-shaped member. While the lens 12d is held on the other end of the lens cap 12c, namely on a surface located opposite to the stem 12a, a space between the lens 12d and the lens cap is also sealed by a sealing member, for example, glass with a low melting point. Also, a portion of the stem 12a forms the sub-mount 12e, and a side surface of this sub-mount 12e extends along the "X" axial direction so as to function as amounting surface 12h. The LD 16 is mounted on this mounting surface 12h via the IC 14.

The LD 16, which is an edge emitting type LD (laser diode), has a front facet 16a and a rear facet 16b. The LD 16 emits light from both the front facet 16a and the rear facet 16b. The LD 16 is mounted on the IC 14 in such a manner that both the front facet 16a and the rear facet 16b intersect the axial line "X", namely, the front facet 16a is optically coupled to the lens 12d, while the rear facet 16b is optically coupled to the PD 18. The PD 18 receives the light emitted from the rear facet 16b of the LD 16 and generates an photo-current corresponding to a magnitude of the emitted light. The PD 18 is mounted on an inclined plane 12i of the stem 12a via a PD carrier 20.

Figure 2:
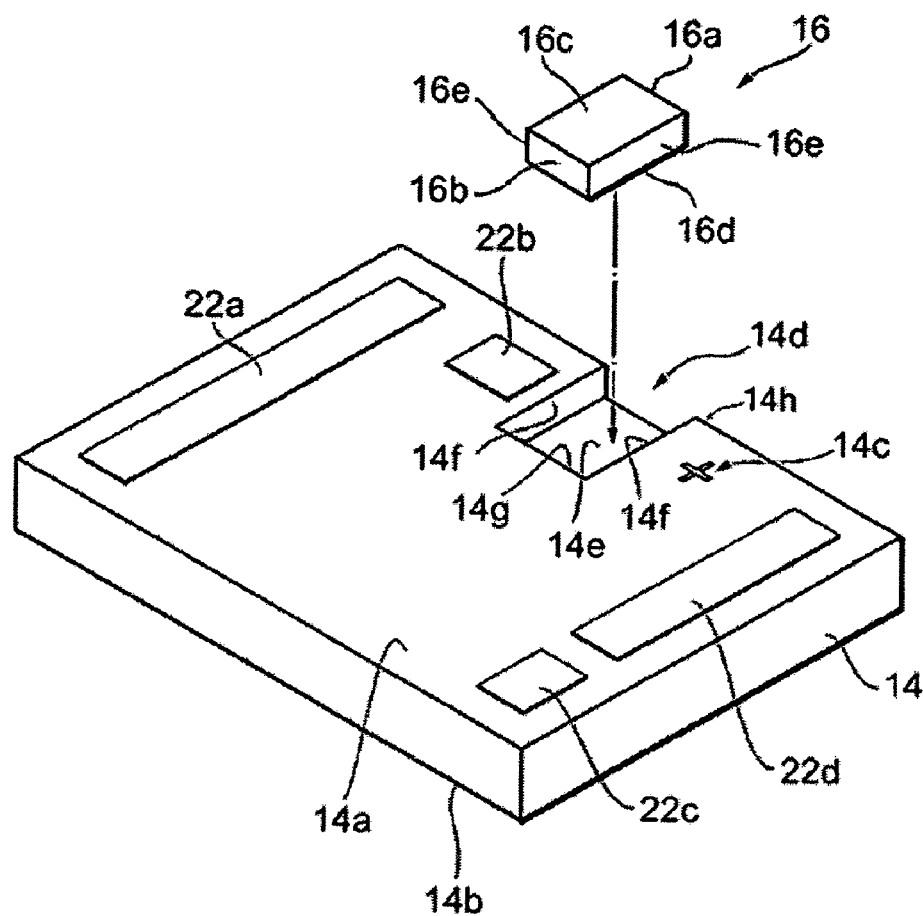
FIG. 2 is an exploded perspective view of an IC and an LD.
Figure 3:
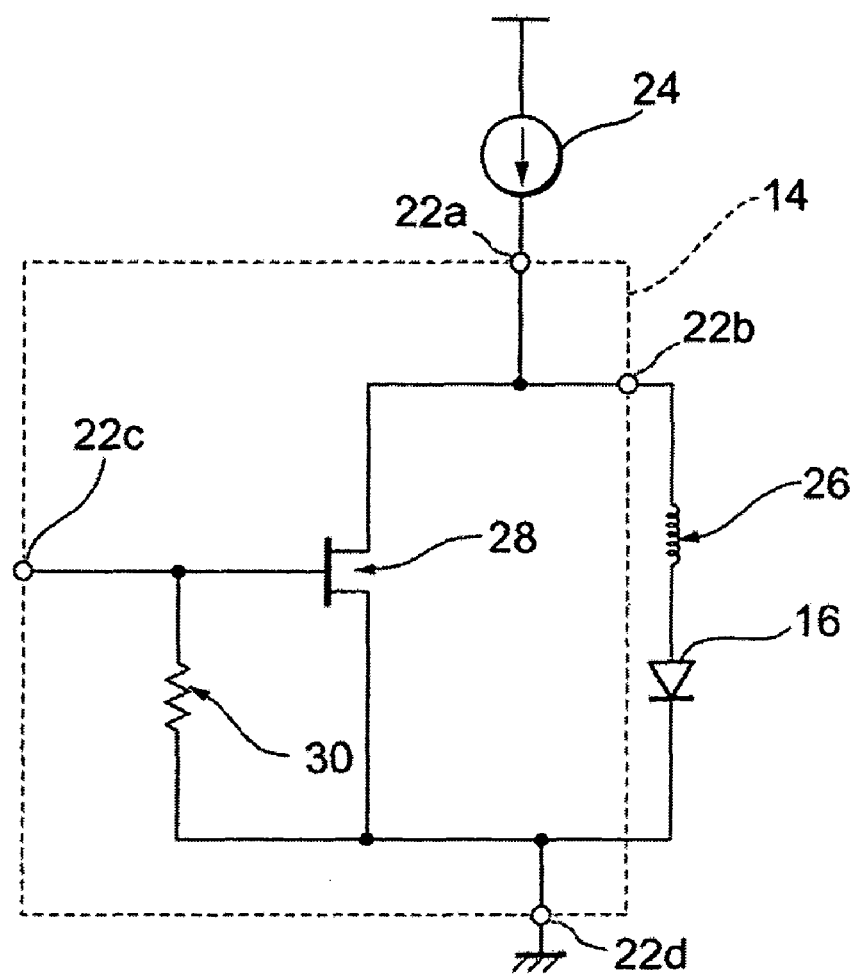
FIG. 3 is a circuit diagram of the IC shown in FIG. 2.

The IC 14 will now be explained in detail. FIG. 2 is an exploded perspective view illustrating the LD 16 and the IC 14 which mounts the ID 16 thereon. FIG. 3 is a circuit diagram of the IC 14 shown in FIG. 2.

The IC 14 shown in FIGS. 2 and 3 is made of, for example, silicon, and a thickness of this IC 14 is about 300 μm. Since a thermal conductivity of silicon is 168 W/m/K, the IC 14 can satisfy a function as a heat sink of the LD 16. Also, the IC 14 has a larger area, as compared with the area of the sub-mount in the conventional light emitting module, accordingly, a heat dissipation path from the LD 16 may be secured.

Specifically, the IC 14 includes an upper surface 14a and a bottom-surface 14b opposite to each other. The bottom surface 14b is fixed to the mounting surface 12h of the package 12 with the solder. A marker 14c may be formed on the upper surface 14a. The marker 14c is used to determine a mounting position of the LD 16 with respect to the IC 14, and also, to determine a mounting position of the IC 14 with respect to the mounting surface 12h of the IC 14. When the IC 14 is made of silicon, the normal semiconductor process may be applicable for forming the marker 14c, and thus, the marker 14c may be easily processed, as compared with the conventional sub-mount made of other materials, for example, an aluminum nitride (AlN), or alumina ($Al_2O_3$).

When the light emitting module 10 is assembled, positioning of the LD 16 with respect to the IC 14 is carried out by performing an image recognition of the marker 14c. Also, referring now to FIG. 1, a projection provided in an assembling jig is fitted into a notch 12j formed in the stem 12a, so that a positional relationship between the jig and the stem 12a is determined. Thus, the image recognition of the marker 14c is carried out, so that a positional relationship between the stem 12a and the IC 14 is determined.

A groove 14d extending from one edge 14h toward a center portion is formed in the IC 14. The LD 16 may be mounted within this groove 14d. In addition to the above-explained front facet 16a and rear facet 16b, the LD 16 has an upper surface 16c, a bottom surface 16d, and a pair of side surfaces 16e.

One electrode of the LD 16 is formed on the upper surface 96c and, on the other hand, another electrode of the LD 16 is formed on the bottom surface 16d. The groove 4d within which the LD 16 is set is defined by the bottom surface 14e, a pair of side walls 14f, and a deep wall 14g. The LD 16 is mounted within the groove 14e in such a manner that the bottom surface 16d of the LD 16 is fixed to the bottom surface 14e of the groove. While the deep wall 14g of the groove 14d is located opposite to the rear facet 16b of the LD 16, a gap between the side walls 14f of the groove 14d and the side surface 16e of the LD 16 is about 10 μm, and a gap between the deep wall 14g and the rear facet 16b is about 10 μm. Since the LD 16 is mounted within the groove 14d in the above-described manner, the relative position between the LD 16 and the groove 14d can be easily determined, and further, it is possible to avoid that solder used to fix the LD 16 to the IC 14 is leaked out. It should also be noted that the depth of the groove 14d is unnecessary to be thicker than the thickness of the LD 16.

Pads 22a to 22d are formed on the upper surface 14a of the IC 14. As illustrated in FIG. 3, the pad 22a is connected to a current source 24 which is installed via a lead terminal 12b to an external portion of the light emitting module 10. The pad 22a is electrically connected to the pad 22b by an interconnection within the IC 14, and the pad 22b is connected to the upper plane electrode of the LD 16 via a bonding wire 26. Furthermore the pad 22d is connected to a transistor 28 formed in the IC 14. A control terminal (gate) of the transistor 28 is connected via an interconnection within the IC 14 to the pad 22c.

The control terminal of the transistor 28 is connected to another terminal (source) of the transistor via a resistor 30 formed within the IC 14. Also, the source of the transistor 28 is connected to the pad 22d via an interconnection within the IC 14, and the pad 22d is connected to the cathode of the LD 16 and the stem 12a. In this IC 14, a drive signal is input to the control terminal (gate) of the transistor 28 via the pad 22c, so that the transistor 28 is switched. In the case that the transistor 28 is in the ON state, since a current flowing from the current source 24 to the pad 22a primarily flows in the side of the transistor 28, the current supplied to the LD 16 is decreased, so that the LD 16 becomes in an extinguishing-state. On the other hand, in the case that the transistor 28 is in the OFF state, a most portion of the drive current from the current source 24 via the pad 22a is supplied to the LD 16, so that the LD 16 emits light.

In the light emitting module 10 according to the present embodiment, since the LD 16 is directly mounted on the IC 14, a length of a bonding wire 26 which connects the pad 22b to the upper electrode of the LD 16 can be shortened. Consequently, inductance of the bonding wire 26 is reduced, so that a high speed modulation of the LD 16 can be realized. As previously explained, the LD 16 can also be positioned on the IC 14 in high precision.

Next, a description is made of other embodiments of the IC 14.

Second Embodiment

Figure 4:
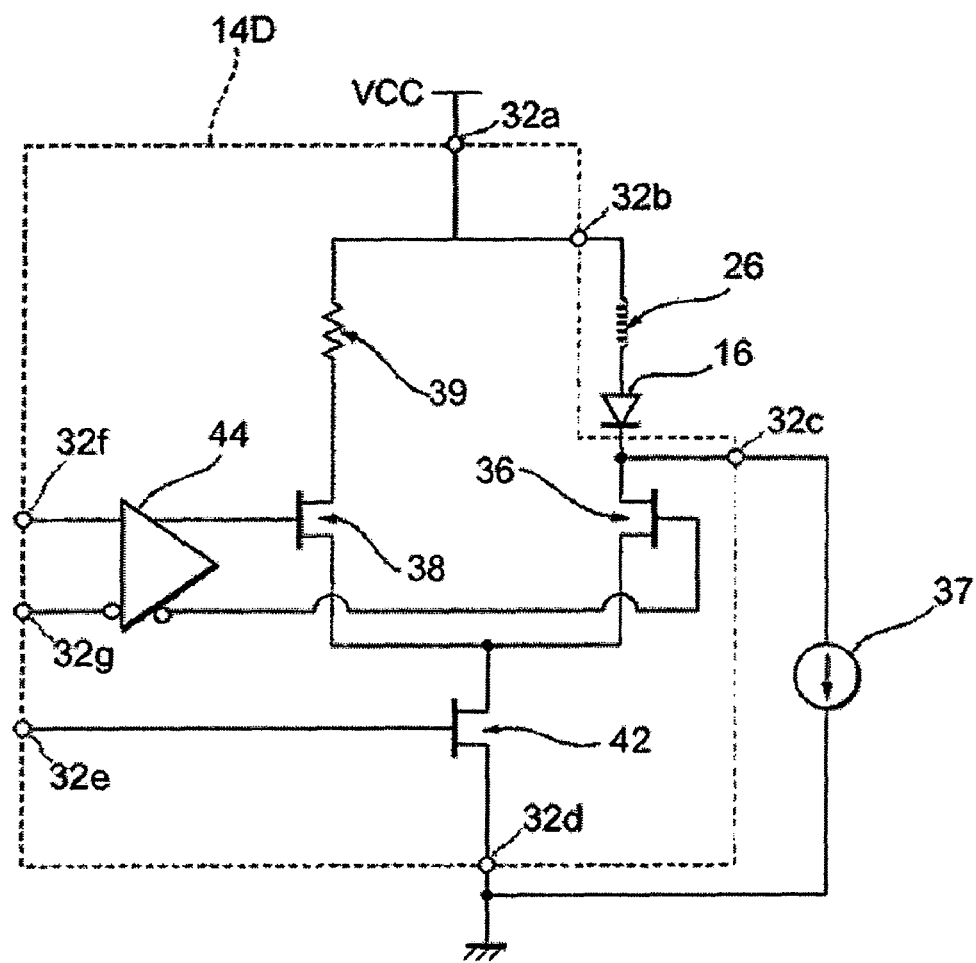
FIG. 4 is a circuit diagram of an integrated circuit according to a second embodiment of the present invention.

FIG. 4 is a circuit diagram illustrating an IC 14D according to a second embodiment of the present invention. The IC 14D illustrated in FIG. 4 configures a differential circuit. As illustrated in FIG. 4, a pad 32a is connected to a resistor 39 within the IC 14D, and on the other hand, is connected to a power supply VCC outside the IC 14D. Another pad 32b is connected to the resistor 39, and this pad 32b is connected via the bonding wire 26 to the upper electrode of the LD 16. On the other hand, the lower electrode of the LD 16 is connected to the pad 32c and a drain of a transistor 36 via an interconnection within the IC 14D. In the IC 14D, a bias current source 37 provided outside the light emitting module 10 is connected to the pad 32c.

The transistor 36 constitutes a differential circuit in combination with another transistor 38. A drain of the transistor 38 is connected via a resistor 39 and the pad 32a to a power supply VCC, and a common source of the transistors 36 and 38 is connected to a drain of a transistor 42 that constitutes a current source. A source of the transistor 42 is connected to the stem 12a via the pad 32d, and a gate thereof is connected to a pad 32e. A signal for determining a supply current to the LD 16 is input to this pad 32e from the outside of the light emitting module 10.

An output of an amplifier 44 is input to the gates of the paired transistors 36 and 38. A differential signal is supplied to this amplifier 44 via the pads 32f and 32g so as to switch the transistors 36 and 38. As a result, the current determined by the transistor 42 is switched by the paired transistors 36 and 38, and then, the switched current is supplied to the LD 16 as a modulation current. Although the bias current source 37 is provided outside the IC 14D in the present embodiment, the bias current source 37 may be alternatively provided inside the IC 14D.

Third Embodiment

Figure 5:
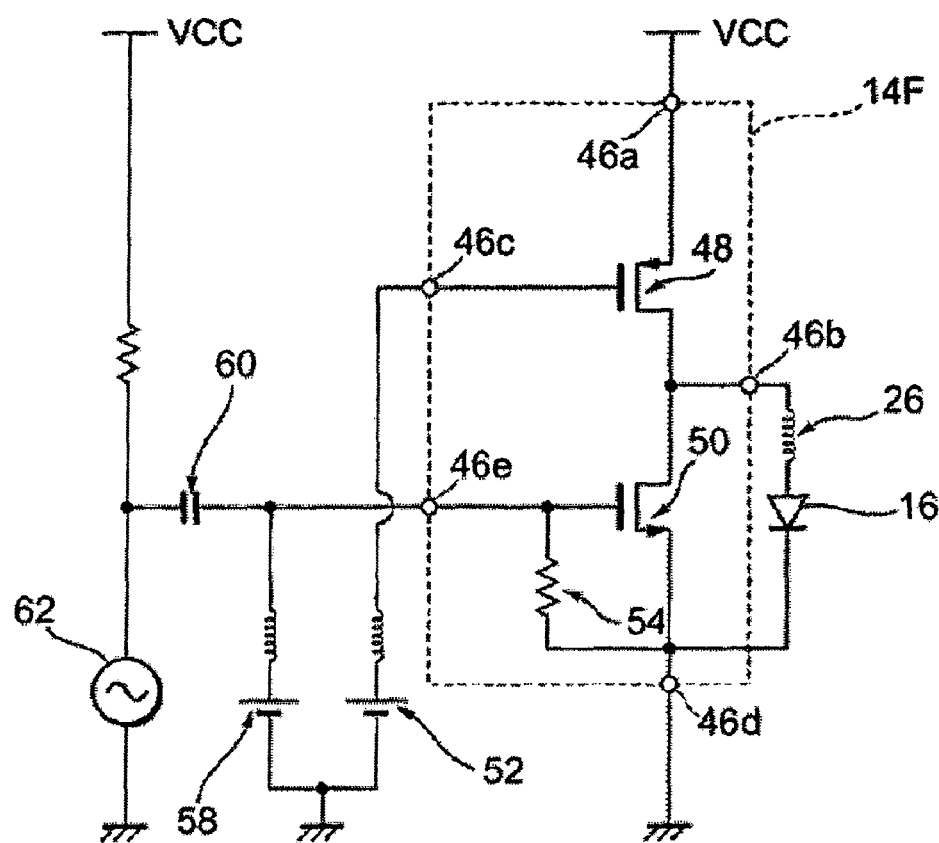
FIG. 5 is a circuit diagram of an integrated circuit according to a third embodiment of the present invention.

FIG. 5 is a circuit diagram showing an integrated circuit (IC 14F) according to a third embodiment of the present invention This IC 14F configures, what is called, a "shunt driver circuit."

Specifically, the IC 14F has a p-type MOS transistor 48 and an n-type MOS transistor 50 which are connected in a tandem manner. A pad 46a is connected to a power supply VCC and a source of the P-MOS transistor 48, and a drain of the transistor 48 and a drain of the N-MOS transistor 50 are connected to the anode (upper electrode) of the LD 16 via a pad 46b and the bonding wire 26. While a gate of the P-MOS transistor 48 is connected to a bias supply 52 via a pad 46c, the transistor 48 operates as a current source with respect to the LD 16 and the N-MOS transistor 50, and a magnitude of the current thereof is determined by the bias supply 52.

A source of the N-MOS transistor 50 is connected to the cathode of the LD 16 and a pad 46d via an interconnection within the IC 14F. The pad 46d is connected to the stem 12a. A gate of the transistor 50 is connected to the source of the transistor 50 via an internal resistor 54 of the IC 14F, and also, to the bias power supply 58 via a pad 46e. A drive signal 62 supplied from an external source is provided to the gate of the N-MOS transistor 50 via a capacitor 60 and the pad 46e.

In this IC 14F, the operating point of the transistor 50 is determined by the bias supply 58, and the switching operation of the transistor 50 is carried out by the driving signal from the signal source 62. In the case that the N-MOS transistor 50 is turned ON, the current from the P-MOS transistor 48 primarily flows through the N-MOS transistor 50, so that the LD 16 becomes in the extinguishing-state. On the other hand, when the transistor 50 is turned OFF, the current from the P-MOS transistor 48 flows through the LD 16, so that the LD 16 becomes in the light emitting state.

Since the bias supply can be built within the IC 14F according to the present embodiment, another bias current source is unnecessary to provide outside the light emitting module 10. Also, the resistor 54 can be formed immediately close to the transistor 50 as a terminator with respect to a characteristic impedance of a signal line routed through the capacitor 60 and the pad 46e, so that waveform degradation of high frequency signals propagating on this signal line can be suppressed.

Fourth Embodiment

Figure 6:
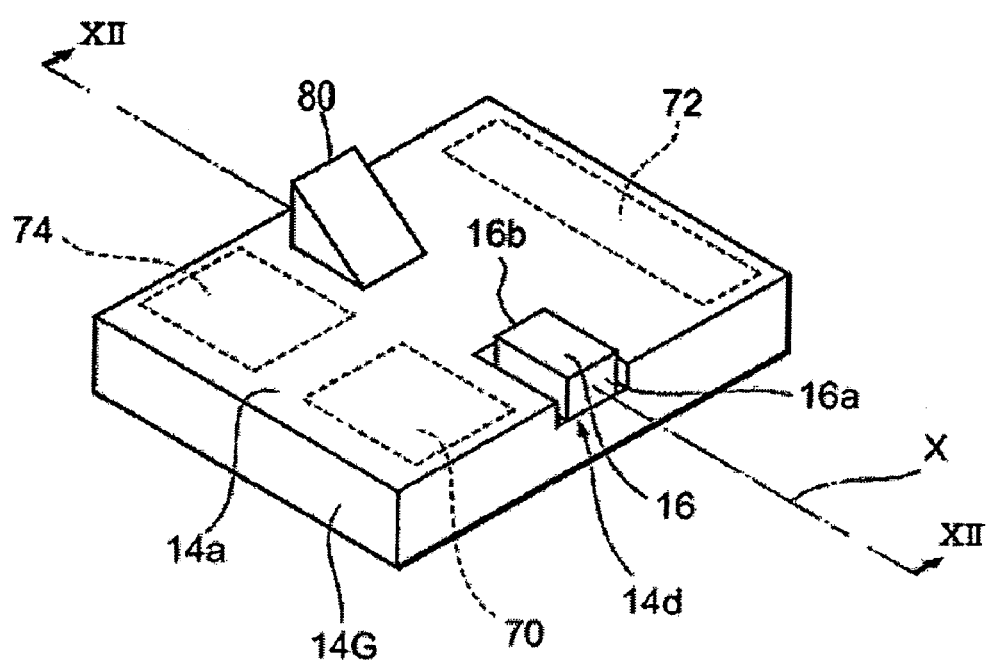
FIG. 6 is a perspective view for showing an integrated circuit according to a fourth embodiment of the present invention.

FIG. 6 is a perspective view showing an integrated circuit 14G according to a fourth embodiment of the present invention. Also, FIG. 7 is a sectional view of the IC 14G, taken along a line XII-XII shown in FIG. 6.

The IC 14G according to the present embodiment includes a first region to a third region, 70, 72 and 74. A driver circuit for providing a drive current to the LD 16 is formed in the first region 70. Also, a coupling capacitor for stabilizing a power supply is mounted on the second region 72. As the driver circuit formed in the first region 70, various types of driver circuits may be applicable, for instance, the driver circuit shown in FIG. 3, the differential driver circuit shown in FIG. 4, the shunt drive circuit shown in FIG. 5, or the like may be applicable.

The first region 70, the groove 14d, and the second region 72 are formed in this order along a direction intersecting to an axial line X. The driver circuit can be arranged close to the LD 16, so that a length of a wire which electrically connects the driver circuit to the LD 16 can be shortened. As a result, the LD 16 may be operated is a high speed.

Figure 7:
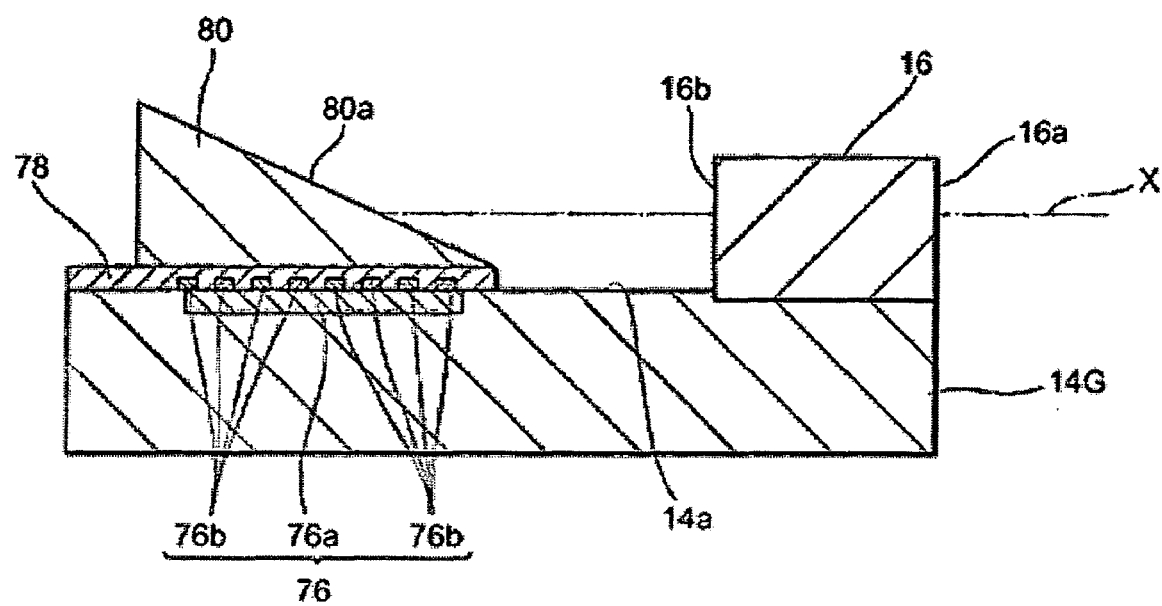
FIG. 7 is a sectional view of the integrated circuit, taken along a line XII-XII of the IC shown in FIG. 6.

As represented in FIG. 7, an MSM-PD (Metal-Semiconductor-Metal Photodiode) 76 is formed in the IC 14G. The MSM-PR) 76 has a light receiving region 76a and a comb type Schottky electrode 76b. The light receiving region 76a is formed on the upper surface 14a of the IC 14G, and the comb shaped Schottky electrode 76b is formed on the light receiving region 76a. Also, a protection film 78 is provided to cover the MSM-PD 76, and a glass block 80 is mounted on the protection film 78. The glass block 80 includes an inclined plane 80a, and the rear facet 16b of the LD 16 is optically coupled to the MSM-PD 76 by this plane 80a. The MSM-PD 76 receives light which is emitted from the rear facet 16b of the LD 16 and is refracted by the glass block 80, and outputs a photo-current in correspondence with the magnitude of the received light.

In the above-explained third region 74, a monitor circuit is formed, while the monitor circuit is electrically connected to the MSM-PD 76 and processes the photo-current output from the MSM-PD 76. In the monitor circuit, a current/voltage converting circuit, and a peak hold circuit are formed, while the current/voltage converting circuit converts the photo-current output from the MSM-PD 76 into a voltage signal, and the peak hold circuit outputs either a maximal value or a minimal value of this converted voltage signal.

The third region 74 can be arranged immediately close to the MSM-PD 76. A photo current flows through, an interconnection which connects the MSM-PD 76 to the monitor circuit, and this photo-current may be easily influenced by noise. Since the monitor circuit is arranged close to the MSM-PD 76, the length of the interconnection which connects the MSM-PD 76 to the monitor circuit can be shortened, so that the influence caused by the noise can be reduced.

Fifth Embodiment

Figure 8:
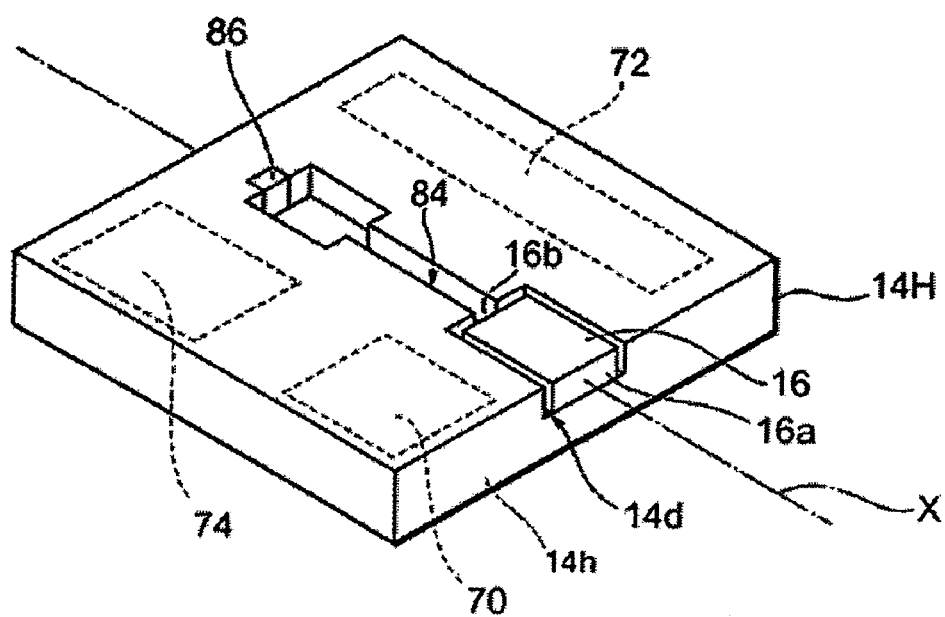
FIG. 8 is a perspective view for showing an integrated circuit according to a fifth embodiment of the present invention.

FIG. 8 is a perspective view for showing an IC 14H according to a fifth embodiment of the present invention. The IC 14H shown in FIG. 8 has a groove 84 and an edge light receiving type PD 86 instead of the MSM-PD 76, and is different from that of the IC 14G.

The PD 86 is provided along an axial line X. An edge surface of the PD 86, namely, alight incident surface is inclined with respect to the axial line X. The photodiode 86 is optically coupled to the rear facet 16b of the LD 16 via the groove 84. The groove 84 is continued to the groove 14d and is extended along the axis X. The groove 84 is not limited only to a straight-shaped groove, but may be a bent groove. In this alternative case, light emitted from the rear facet 16b of the LD 16 is entered into the PD 86 via a reflection on a wall which defines the bent groove. Therefore, it is preferable to improve a reflectance by forming a reflection film on this wall.

The present invention is not limited only to the above-explained embodiments, but may be modified in various modes. For instance, although the light emitting module of the above-explained embodiments corresponds to the light emitting module equipped with the LD as the optical element, namely the optical transmitting sub-assembly, the light emitting module of the present invention may be a light emitting module equipped with a PD as an optical element, namely an optical receiving sub-assembly.

What is claimed is:

1. A light emitting module, by receiving an electric signal, for emitting an optical signal corresponding to the received electrical signal, comprising:

a semiconductor laser diode for emitting the optical signal, the semiconductor laser diode being an edge-emitting diode having a front facet and a rear facet;

an integrated circuit configured to receive the electrical signal to drive the semiconductor laser diode, the integrated circuit integrating at least one transistor and being made of silicon with a marker provided thereon to determine a position of the semiconductor laser diode relative to the integrated circuit, the integrated circuit providing a groove extending from an edge thereof toward a center portion of the integrated circuit; and a package configured to enclose the semiconductor laser diode and the integrated circuit therein, the package including a disk-shaped stem and a cylindrical-shaped lens cap connected to the stem to define a space that encloses the semiconductor laser diode and the integrated circuit therein, the stem including a sub-mount with a side surface extruding from a primary surface of the stem, wherein the integrated circuit has a thickness smaller than 300 µm, the integrated circuit is mounted on the side surface of the sub-mount and the semiconductor laser diode is directly mounted within the groove on the integrated circuit in such a manner that the front facet is arranged along the edge of the integrated circuit, and the integrated circuit is a shunt driver configured with a driving transistor connected in parallel to the semiconductor laser diode.

2. The light emitting module as claimed in claim 1, further comprising: a photodiode for receiving light emitted from the rear facet of the semiconductor laser diode.

3. The light emitting module as claimed in claim 2, further comprising:

a means for converting an optical path between the semiconductor laser diode and the photodiode, wherein the photodiode is a type of a surface receiving photodiode formed on a surface of the integrated circuit, the photodiode receiving light emitted from the rear facet of the semiconductor laser diode via the means for converting the optical path.

4. The light emitting module as claimed in claim 2, wherein the integrated circuit includes a circuit for processing a photo-current output by the photodiode.

5. The light emitting module as claimed in claim 1, wherein the integrated circuit includes a plurality of pads on a surface thereof; and wherein the semiconductor laser diode is wire-bounded to the plurality of pads.

6. A light emitting module for emitting an optical signal corresponding to a received electrical signal, comprising:

a semiconductor laser diode for emitting the optical signal;
an integrated circuit for receiving the electrical signal to drive the semiconductor laser diode;
and a package for enclosing the semiconductor laser diode and the integrated circuit therein, wherein the semiconductor laser diode is mounted on the integrated circuit, wherein the package further includes a disk-shaped stem and a cylindrical shaped lens cap connected to the stem for defining a space that encloses the semiconductor laser diode and the integrated circuit therein, the stem including a sub-mount extruding from a primary surface of the stem, wherein the semiconductor laser diode is an edge-emitting type having front and rear facets, the semiconductor laser diode being mounted on the integrated circuit in such a manner that the front facet is arranged along an edge of the integrated circuit, wherein the integrated circuit is mounted on a side surface of the sub-mount, wherein the light emitting module further comprises a photodiode for receiving light emitted from the rear facet of the semiconductor laser diode, wherein the integrated circuit includes a first groove extending from the edge of the integrated circuit toward a center portion of the integrated circuit, and a second groove connected to the first groove, wherein the semiconductor laser diode is mounted within the first groove in such a manner that the front facet of the semiconductor laser diode is matched with the edge of the integrated circuit, and wherein the photodiode is mounted within the second groove.

7. A light emitting module by receiving an electric signal, for emitting an optical signal corresponding to the received electrical signal, comprising:

a semiconductor laser diode for emitting the optical signal, the semiconductor laser diode being an edge-emitting diode having a front facet and a rear facet;

an integrated circuit configured to receive the electrical signal to drive the semiconductor laser diode, the integrated circuit integrating at least one transistor and being made of silicon with a marker provided thereon to determine a position of the semiconductor laser diode relative to the integrated circuit, the integrated circuit providing a groove extending from an edge thereof toward a center portion of the integrated circuit; and a package configured to enclose the semiconductor laser diode and the integrated circuit therein, the package including a disk-shaped stem and a cylindrical-shaped lens cap connected to the stem to define a space that encloses the semiconductor laser diode and the integrated circuit therein, the stem including a sub-mount with a side surface extruding from a primary surface of the stem, wherein the integrated circuit has a thickness smaller than 300 µm, the integrated circuit is mounted on the side surface of the sub-mount and the semiconductor laser diode is directly mounted within the groove on the integrated circuit in such a manner that the front facet is arranged along the edge of the integrated circuit, and the integrated circuit is a series driver configured with a driving transistor connected in series to the semiconductor laser diode.

8. The light emitting module as claimed in claim 7, further comprising: a photodiode for receiving light emitted from the rear facet of the semiconductor laser diode.

9. The light emitting module as claimed in claim 8, further comprising:
a means for converting an optical path between the semiconductor laser diode and the photodiode,
wherein the photodiode is a type of a surface receiving photodiode formed on a surface of the integrated circuit, the photodiode receiving light emitted from the rear facet of the semiconductor laser diode via the means for converting the optical path.

10. The light emitting module as claimed in claim 8, wherein the integrated circuit includes a circuit for processing a photo-current output by the photodiode.

* * * * *